(12) United States Patent
Kant et al.

(10) Patent No.: US 7,136,308 B2
(45) Date of Patent: Nov. 14, 2006

(54) EFFICIENT METHOD OF DATA TRANSFER BETWEEN REGISTER FILES AND MEMORIES

(75) Inventors: Shree Kant, Union City, CA (US); Kenway Tam, Cupertino, CA (US); Poonacha P. Kongetira, Menlo Park, CA (US); Yuan-Jung D Lin, San Jose, CA (US); Zhen W. Liu, Sunnyvale, CA (US); Kathirgamar Aingaran, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/979,345

(22) Filed: Nov. 1, 2004

(65) Prior Publication Data

US 2006/0092710 A1    May 4, 2006

(51) Int. Cl.
*G11C 7/10* (2006.01)
(52) U.S. Cl. .......................... 365/189.01; 365/185.14; 365/185.23
(58) Field of Classification Search ........... 365/189.01, 365/220, 221, 45, 189.04, 189.05, 185.07, 365/185.14, 185.23, 185.25
See application file for complete search history.

(56) References Cited

U.S. PATENT DOCUMENTS

| 5,778,243 | A | | 7/1998 | Aipperspach et al. ... | 395/800.11 |
|---|---|---|---|---|---|
| 5,963,495 | A | * | 10/1999 | Kumar ...................... | 365/207 |
| 6,141,259 | A | * | 10/2000 | Scott et al. ............ | 365/189.06 |
| 6,157,578 | A | * | 12/2000 | Brady .................... | 365/189.05 |
| 6,172,894 | B1 | * | 1/2001 | Hannum ...................... | 365/49 |
| 6,353,551 | B1 | | 3/2002 | Lee ............................. | 365/154 |
| 6,501,698 | B1 | * | 12/2002 | Mobley ...................... | 365/221 |
| 2004/0017709 | A1 | * | 1/2004 | Braceras ..................... | 365/201 |
| 2004/0252536 | A1 | * | 12/2004 | Ferrant ......................... | 365/45 |

* cited by examiner

*Primary Examiner*—Richard Elms
*Assistant Examiner*—Dang Nguyen
(74) *Attorney, Agent, or Firm*—Martine Penilla & Gencarella, LLP

(57) ABSTRACT

A memory system includes an active storage circuit and at least one base storage circuit. The at least one base storage circuit is coupled to the active storage circuit though at least one pass gate, at least one driver and a bit line. The at least one pass gate and the at least one driver have a device size substantially similar to a device size of each one of the devices in the active storage circuit and the at least one base storage circuit. A method of swapping data between two storage circuits is also described.

17 Claims, 7 Drawing Sheets

EFFICIENT METHOD OF DATA TRANSFER BETWEEN REGISTER FILES AND MEMORIES

BACKGROUND OF THE INVENTION

1. Field of the Invention

The present invention relates generally to computer memory systems, and more particularly, to methods and systems for moving data between two memory locations.

2. Description of the Related Art

Computer memory systems are very common and are used in many different configurations. A typical block of memory includes a block of memory cells and input and output circuitry that allows the block of memory cells to communicate with a device or system that is external to the block of memory.

FIG. 1A shows a typical microprocessor 100. The microprocessor 100 includes a first block of memory 110 includes a block of memory cells 102 and a block of input and output (I/O) circuitry 104. Each one of the memory cells 102 includes a storage circuit 112 (e.g., cross-coupled inverters), one or more keeper circuits 114, and pre-charge circuits 116. The storage circuit 112 stores a selected voltage level that corresponds to a logic value of 1 or 0. The keeper circuits 114 assist the storage circuit 112 in maintaining the selected voltage level. The pre-charge circuits 116 pre-charge the bit lines that are used to read and/or write the voltage level stored in the storage circuit 112.

Typically, the storage circuit 112 stores one of two voltage levels. Typically a low voltage level corresponds to a logical "0" value and a high voltage level corresponds to a logical "1" value. The actual voltage of the high voltage level and the low voltage level is a function of the design (i.e., type) of the storage circuit 112. By way of example, in a first-type of storage circuit 112 a voltage lower than 0.3 volts could be considered a low voltage level and therefore a logical 0. Similarly, a voltage higher than 0.6 volts could be considered a high voltage level and therefore a logical 1 in the first-type storage circuit 112. Conversely, in a second-type storage circuit 112 a voltage greater than 0.3 volts could be considered a high voltage level and therefore a logical 1. Similarly, the second-type storage circuit 112 would require a low voltage level of less than about 0.1 or 0.2 to indicate low voltage level that would correspond to a logical 0.

The block of I/O circuitry 104 includes a sense amplifier 122 on the read line and a write amplifier 124 on a write line. The sense amplifier 122 detects the voltage level of the logic stored in the storage circuit 112 and amplifies the detected the voltage level. The sense amplifier 122 can then communicate the voltage level stored in the storage circuit 112 to an external device such as a bus 130. By way of example, the sense amplifier 122 can detect a voltage level that corresponds to a logical 1 (e.g., greater than about 0.6 volts) stored in the second-type storage circuit 112. The circuits external to the first block of memory 110 may be designed to recognize voltage level of about 1 volt to represent a logical 1. Therefore, the sense amplifier 122 amplifies the detected 0.6 volts to about 1 volt so as to accurately transmit the data value stored in the second-type storage circuit 112.

Similarly, the write amplifier 124 detects and amplifies a voltage level on an external device (e.g., bus 130) and communicates the amplified voltage level to the storage circuit 112. By way of example, a logical voltage of about 0.3 volts is detected on the bus 130 by the write amplifier 124. The write amplifier 124 must accurately discriminate whether the detected 0.3 volts represents a logical one or a logical zero. The write amplifier 124 then modifies (e.g., amplify or reduce) the detected 0.3 volt logic value to either a logical 1 voltage level or a logical 0 voltage level that can be accurately stored in the storage circuit 112.

The microprocessor 100 can also include a second block of memory 140 and a processor core 150. The second block of memory 140 and the processor core 150 can also be coupled to the bus 130. The second block of memory 140 includes a second storage circuit 142. As the processor core 150 performs logical operations, it is often necessary to swap the data from the first block of memory 110 to the second block of memory 140 via the bus 130.

FIG. 1B is a flowchart diagram of the method operations 160 of performing the data swap operation form the first memory 110 to the second memory 140. In an operation 162, the sense amplifier 122 must detect the data voltage level stored in the storage circuit 112. In an operation 164, the sense amplifier 122 amplifies the detected data voltage level. In an operation 166, the amplified data voltage level is communicated across the bus 130 to the second block of memory 140. In an operation 168, the write amplifier 124 detects the communicated voltage level on the bus 130. In an operation 170, the write amplifier 124 amplifies the detected voltage level. In an operation 172, the amplified voltage level is stored in the second storage circuit 142.

The method operations 160 of performing the data swap is a very complex and time consuming process as the data voltage level must be amplified and detected multiple times and communicated a relatively long distance across the bus 130. This time consuming process slows down the effective speed of the processor core 150. Further, the sense amplifiers 122 and write amplifiers 124 are relatively large devices (e.g., typically more than 50 or even 100 times the device sizes of the devices that form the storage circuits 112 and 142) and thereby consume excess space on the semiconductor substrate upon which the microprocessor 100 is formed.

Typically, the sense amplifier 122, the write amplifier 124, the keeper circuits 114 and the pre-charge circuits 116 have substantially larger physical size than the devices (e.g., transistors, inverters, PMOS, NMOS, etc.) that form the storage circuit 112. By way of example, the devices that form the storage circuit 112 can have a width of about 0.5 or 0.3 micron or even smaller. In comparison the keeper circuits 114 and the pre-charge circuits 116 can have a width of about 40–50 micron and the sense amplifier 122, the write amplifier 124 can have a width of about 100 micron or greater. These large device sizes 122 and 124 exacerbate the problem by causing the bus 130 (or other interconnecting circuits and conductive lines) to be larger and longer and the memory blocks 110 and 140 further apart and further from the processor core 150. These large device sizes 122 and 124 further limit the number of memory blocks that can be included on the microprocessor 100.

In view of the foregoing, there is a need for a more efficient system and method for moving data between multiple memory blocks.

SUMMARY OF THE INVENTION

Broadly speaking, the present invention fills these needs by providing a more compact memory system and a more efficient method of transferring data between cells in the memory system. It should be appreciated that the present invention can be implemented in numerous ways, including as a process, an apparatus, a system, computer readable media, or a device. Several inventive embodiments of the present invention are described below.

One embodiment provides a memory system that includes an active storage circuit and at least one base storage circuit. The at least one base storage circuit is coupled to the active storage circuit through at least one pass gate, at least one driver and a bit line. The at least one pass gate and the at least one driver have a device size substantially similar to a device size of each one of the devices in the active storage circuit and the at least one base storage circuit.

The memory system can be included in a microprocessor. The at least one pass gate can include at least one save pass gate and at least one restore pass gate. The at least one restore pass gate has a device size substantially similar to a device size of each one of a set of devices in the active storage circuit and the at least one base storage circuit and wherein the at least one save pass gate has a device size sufficient to overcome a parasitic read operation.

The memory system can also include a pre-charge circuit coupled to the at least one bit line. The memory system can also include a keeper circuit coupled to the at least one bit line. The memory system can also include a timing and control circuit coupled to the at least one bit line.

The at least one base storage circuit can include multiple base storage circuits and wherein each one of the multiple base storage circuits corresponds to a processing thread in a multi-thread processor.

Another embodiment provides a memory system. The memory system including an active storage circuit, multiple base storage circuits, a first bit line and a second bit line. The active storage circuit having a first active node and a second active node. Each one of the base storage circuits including a corresponding first base node and a corresponding second base node. The first bit line is coupled between the first active node and each one of the first base nodes. The first bit line including a first save pass gate and a first save driver coupled in series to the first node and a first restore pass gate and a first restore driver coupled in series to the first node. The second bit line is coupled between the second active node and each one of the of second base nodes. The second bit line including a second save pass gate and a second save driver coupled in series to the second node and a second restore pass gate and a second restore driver coupled in series to the second node. The first save pass gate, the first save driver, the first restore pass gate, the first restore driver, the second save pass gate, second save driver, the second restore pass gate and the second restore driver have a device size substantially similar to a device size of each one of a multiple of devices in the active storage circuit and the multiple base storage circuits.

Another embodiment provides a method of swapping data between two storage circuits. The method includes activating a first pass gate between a first storage circuit and a first bit line and activating a second pass gate between a second storage circuit and the first bit line. The data stored in the first storage circuit can be driven to the first bit line and the data on the first bit line can be stored in the second storage circuit.

Driving the data stored in the first storage circuit to the first bit line can include amplifying the data stored in the first storage circuit in an amplification circuit having device sizes substantially equal to the devices in the first storage circuit and the second storage circuit. Driving the data stored in the first storage circuit to the first bit line can include amplifying the data stored in the first storage circuit in an amplification circuit having device sizes sufficient to overcome a parasitic read operation.

The first pass gate can be a save pass gate and wherein the save pass gate is activated at least a first time delay before the second pass gate is activated. The first time delay can be equal to about two gate delays. The first time delay can be sufficient to allow a sufficient voltage differential to be developed on the first bit line.

The method can also include applying a keeper circuit to the first bit line. The first storage circuit can be an active storage circuit and the second storage circuit can be a base storage circuit. The base storage circuit includes multiple base storage circuits and wherein each one of the multiple base storage circuits corresponds to a processing thread in a multi-thread processor.

Yet another embodiment provides a method of performing a data swap in a multi-threaded microprocessor. The method includes activating a first active pass gate between a first node of an active storage circuit and a first bit line and activating a second active pass gate between a second node of the active storage circuit and a second bit line. The method also includes activating a first base pass gate between a first node of a base storage circuit and the first bit line and activating a second base pass gate between a second node of a base storage circuit and the second bit line. The data can be stored in the active storage circuit to the first bit line and the second bit line. The data on the first bit line and the second bit line can be stored in the base storage circuit.

The base storage circuit can be one of multiple base storage circuits coupled to the first bit line and the second bit line and wherein each one of the multiple base storage circuits corresponds to one of several processing threads. Activating the first base pass gate and activating the second base pass gate can include receiving a thread select control signal that corresponds to a selected process thread and a corresponding base storage circuit.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION OF THE EXEMPLARY EMBODIMENTS

Several exemplary embodiments for a more compact memory system and a more efficient method of transferring data between cells in the memory system will now be described. It will be apparent to those skilled in the art that the present invention may be practiced without some or all of the specific details set forth herein.

As described above it is often desirable to transfer data between two memory locations. By way of example, a processor may be processing a first set of data to a first interim result using a portion of active memory (e.g., an active register). The processor may be unable to fully process the first set of data to achieve a final result because the processor needs a second set of data that is not yet available. As a result, the first interim results and possibly even the first set of data may be transferred from the active register to a second storage location. The processor can then transfer other data to the active register and process the other data to determine the second set of data. Then the second set of data, the first interim results and/or the first set of data can be stored in the active register of the memory and processed to determine the final results.

Figure 1A:
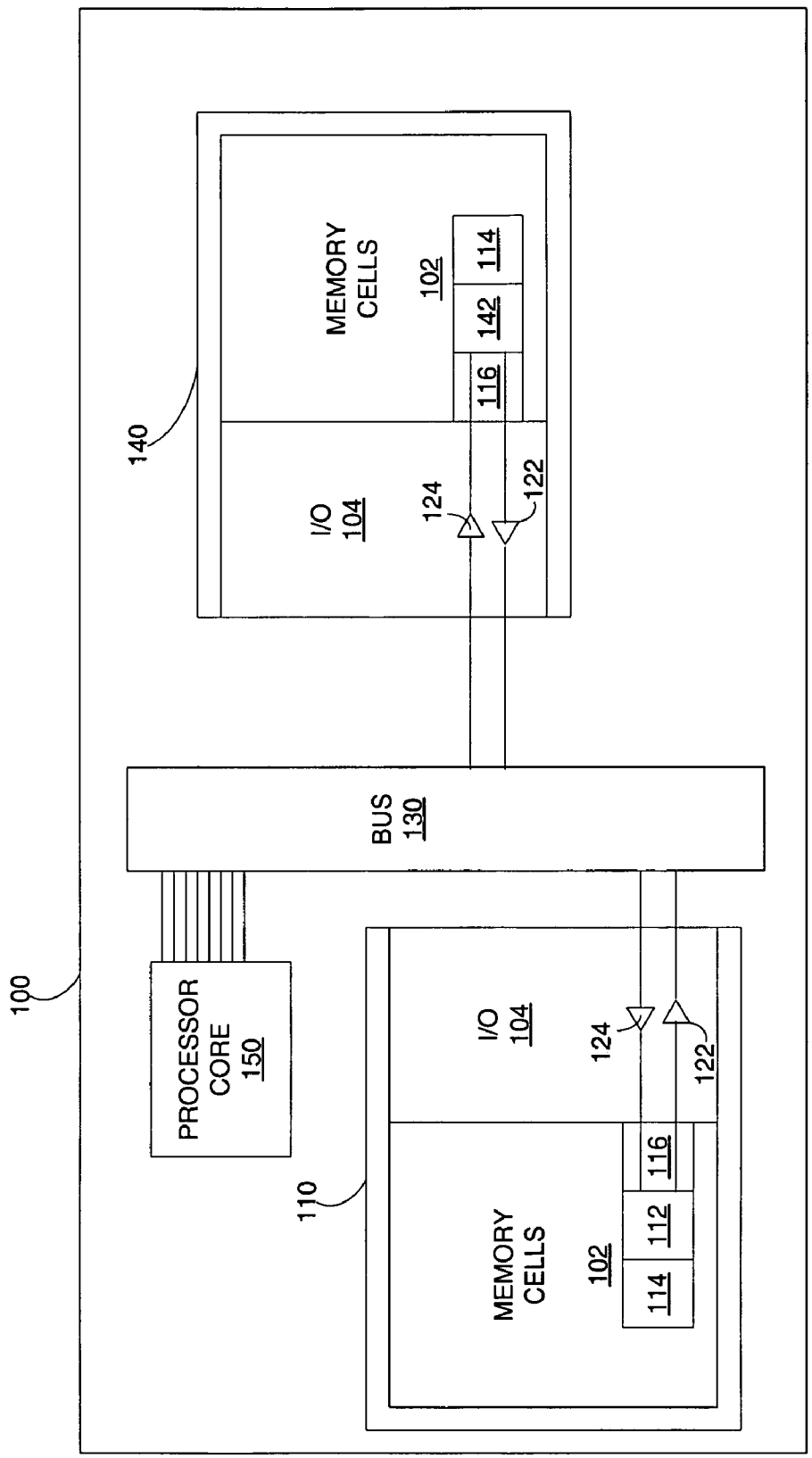
FIG. 1A shows a typical microprocessor.
Figure 1B:
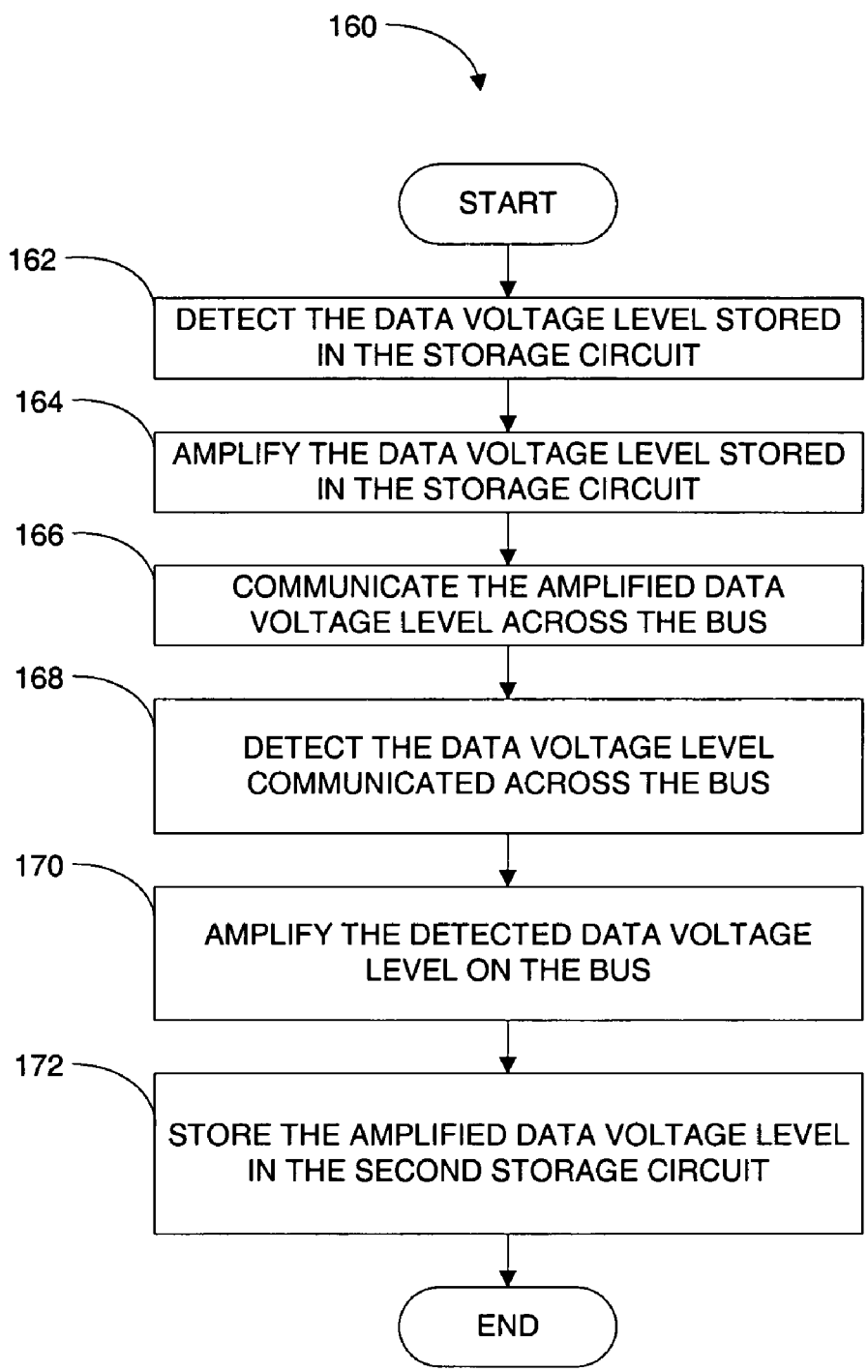
FIG. 1B is a flowchart diagram of the method operations of performing the data swap operation form the first memory to the second memory.
Figure 2:
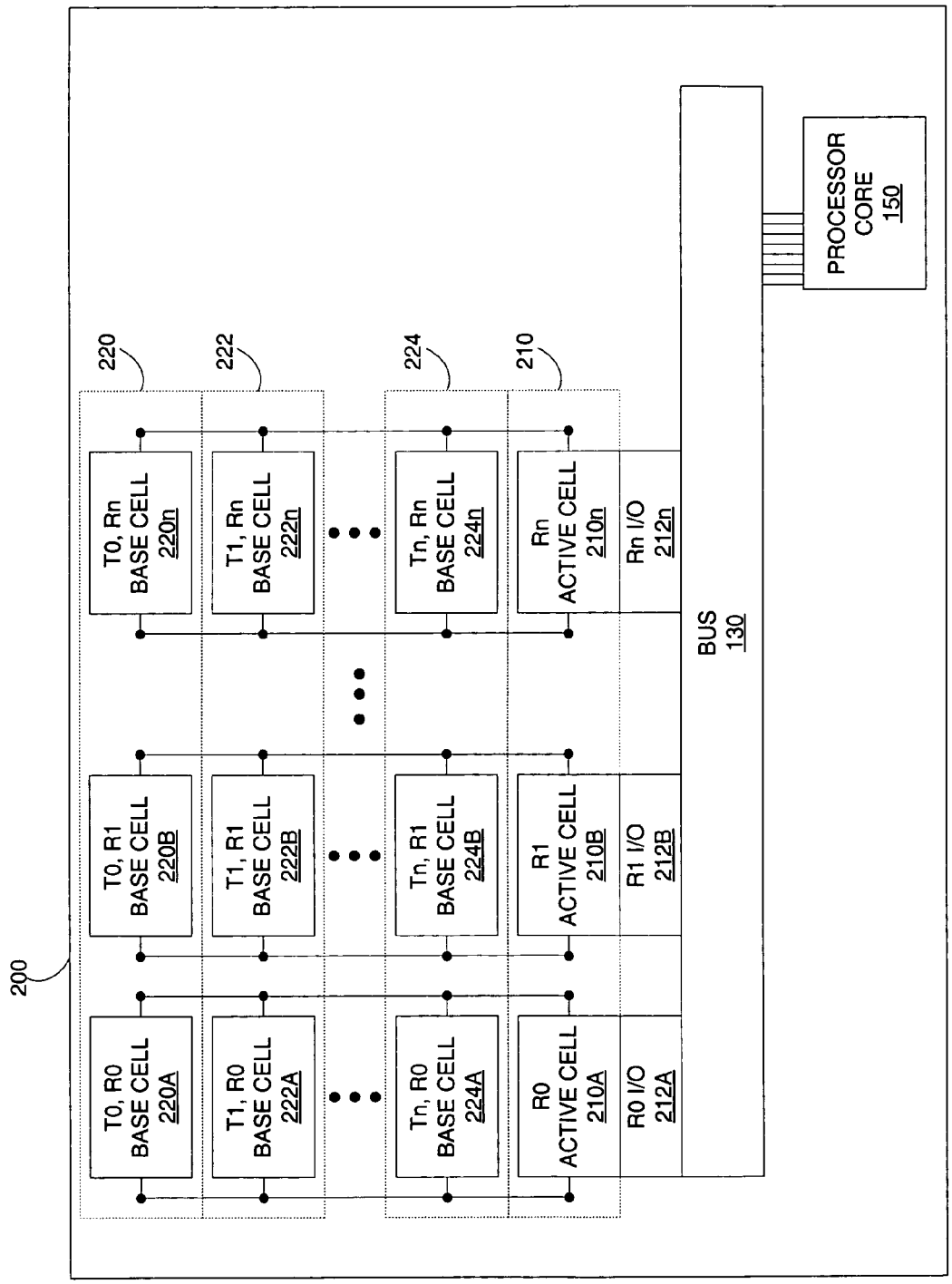
FIG. 2 is a block diagram of a multi-thread processor, in accordance with one embodiment of the present invention.

FIG. 2 is a block diagram of a multi-thread processor 200, in accordance with one embodiment of the present invention. The multi-thread processor 200 includes a processor core 150 that is coupled to a bus 130. An active register 210 includes multiple active cells 210A–210n that represent memory locations R0 through Rn in the register. Each active cell 210A–210n is coupled to the bus 130 by a respective I/O circuit 212A–212n.

The multi-thread processor 200 includes multiple processing threads: Thread 0 (T0) 220, Thread 1 (T1) 222 through Thread n (Tn) 224. The multi-thread processor may have four or eight or even more processing threads. Each of the processing threads 220, 222 and 224 includes a corresponding set of base cells 220A–220n, 222A–222n and 224A–224n. Each active cell 210A–210n is also coupled directly to one base cell in each of the processing threads 220, 222 and 224. By way of example, active cell 210B is coupled directly to base cells 220B, 222B and 224B in each of the processing threads 220, 222 and 224.

Figure 3:
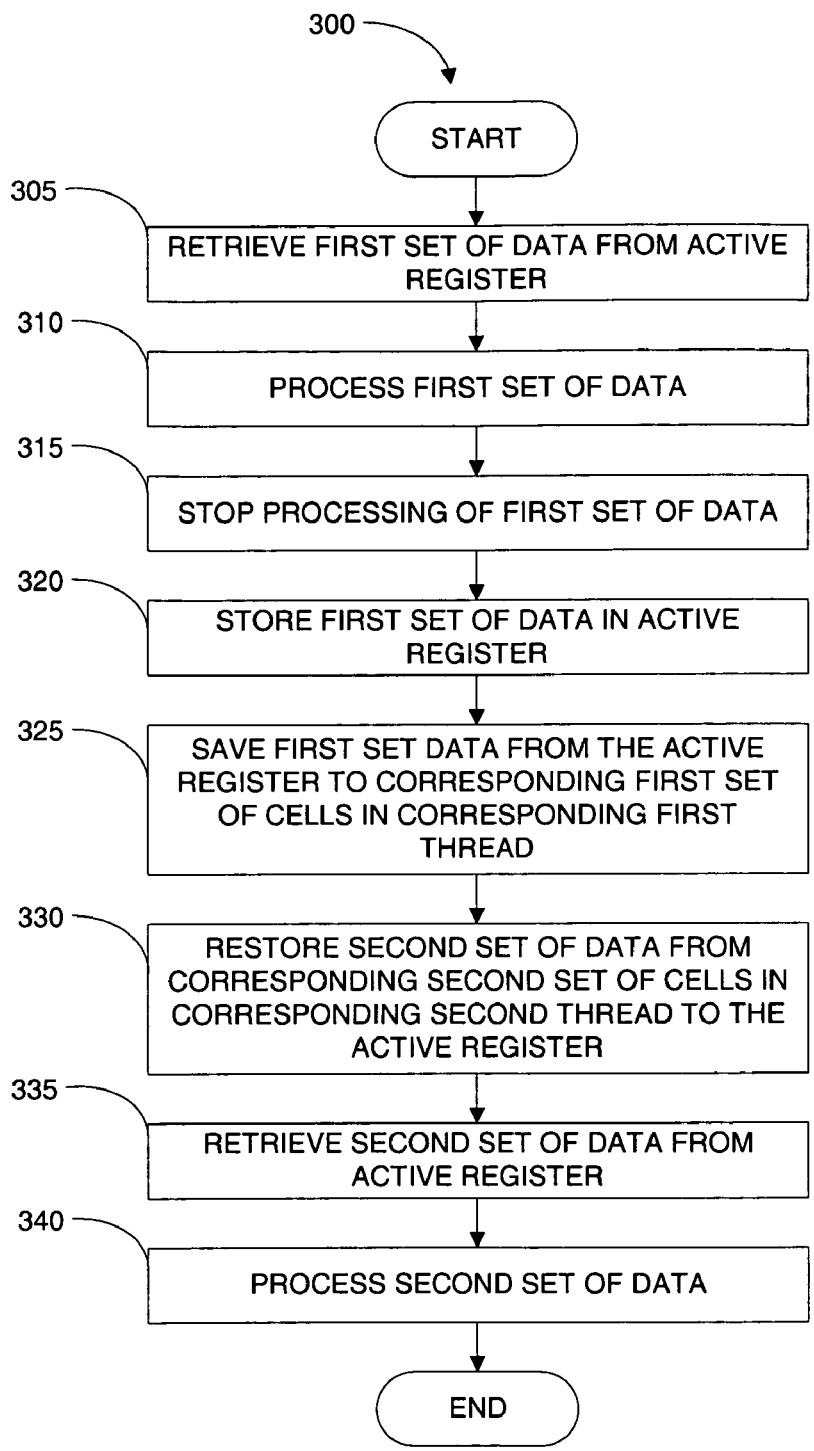
FIG. 3 is a flowchart of the method operations of the operations of the multi-thread processor, in accordance with one embodiment of the present invention.

FIG. 3 is a flowchart of the method operations 300 of the operations of the multi-thread processor 200, in accordance with one embodiment of the present invention. The multi-thread processor switches between processing threads to perform the processing. Typically, the multi-thread processor will process a first thread until the first thread stalls due to needing data that is not yet available. The multi-thread processor can also interrupt processing of the first thread such as due to a higher priority processing request by a second thread. By way of example, in an operation 305, a first set of data is retrieved from the active register 210 for processing. The processing can be in a processor (e.g., a multi-thread processor 200).

In an operation 310, the first set of data is processed until processing is stopped in an operation 315. The processing the first set of data may be stopped due to an interrupt or a stall or for some other reason.

In an operation 320, the first set of data is stored in the active register 210. Storing the first set of data is stored in the active register 210 can also include saving the first set of data from the active register to a corresponding first set of cells 220A–220n, in a corresponding first thread 220, in an operation 325.

In an operation 330, a second set of data is restored from a corresponding second set of cells 222A–222n, in a corresponding second thread 222, to the active register 210. In an operation 335, the second set of data is retrieved from the active register 210 for processing in an operation 340. The method operations can then continue to switch between threads as described above in operations 315–340.

Figure 4:
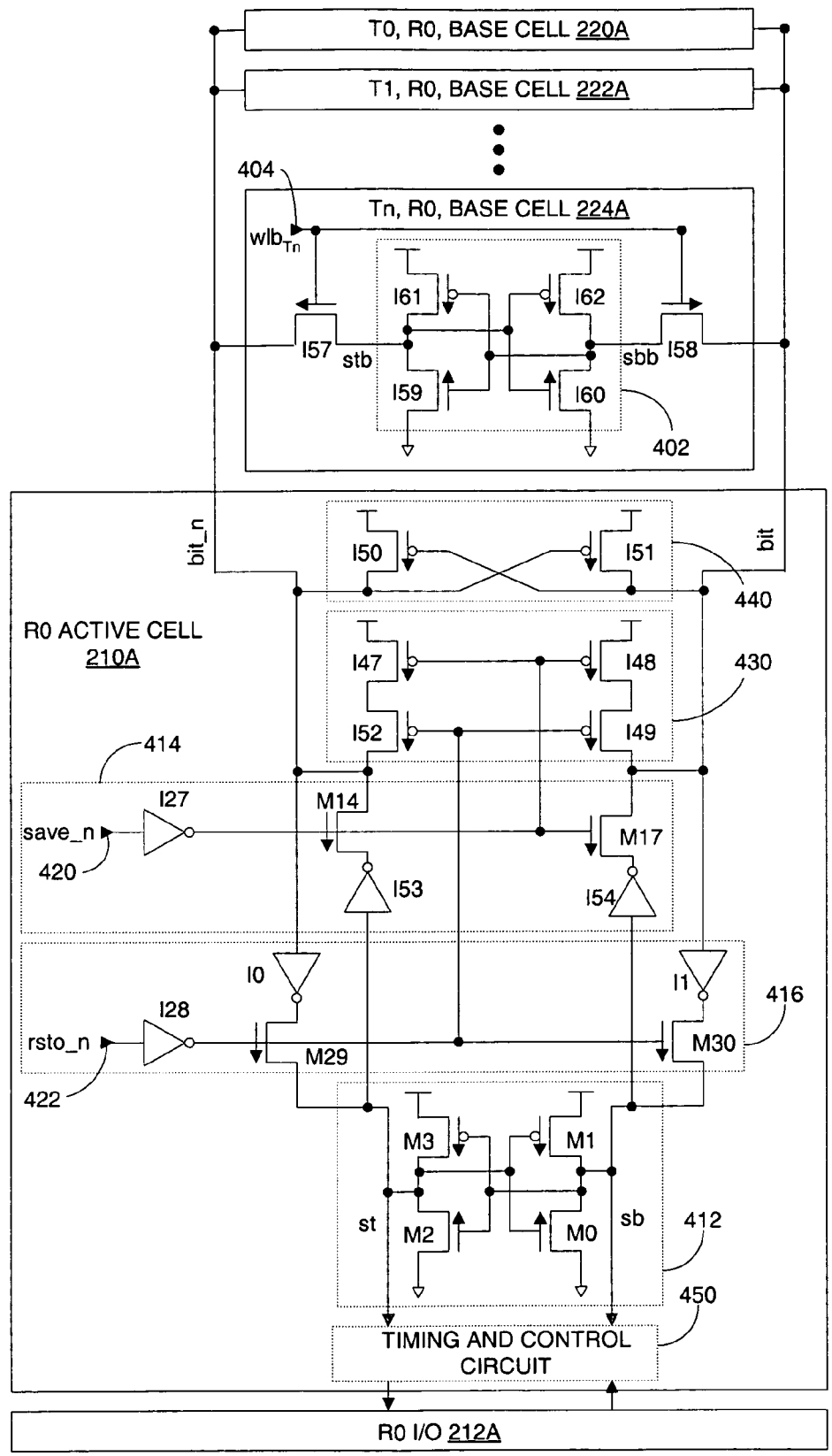
FIG. 4 is a schematic diagram of an active cell and corresponding base cells, in accordance with one embodiment of the present invention.

FIG. 4 is a schematic diagram of an active cell 210A and corresponding base cells 220A, 222A and 224A, in accordance with one embodiment of the present invention. The base cell 224A includes a storage circuit 402 as is well known in the art. It should be known that the storage circuit 402 is shown as a cross-coupled inverter structure as an exemplary structure only. The storage circuit 402 is not limited to the cross-coupled inverter structure shown. The storage circuit 402 can include any structure capable of storing data that can later be read from the structure. The cross-coupled inverter circuit includes PMOS devices I61 and I62 and NMOS devices I59 and I60 with the cross-coupled gates as shown.

The base cell 224A also includes a control signal input 404 that allows a control signal $wlb_{Tn}$ to be selectively applied to the bases of the NMOS devices I57 and I58. Applying an appropriate control signal $wlb_{Tn}$ to the gates of the NMOS devices I57 and I58 causes the NMOS devices I57 and I58 to conduct. When the NMOS devices I57 and I58 are conducting a data value can be stored in or read from the storage circuit 402.

The control signal $wlb_{Tn}$ can also be applied when a respective thread is selected. By way of example, if the Thread n (Tn) is selected then $wlb_{Tn}$ can also be applied to base cell 224A. Similarly, if the Thread 0 (T0) is selected, then a respective control signal $wlb_{T0}$ can also be applied to base cell 220A.

The active cell 210A includes a storage circuit 412. The storage circuit 412 is shown as a cross-coupled inverter circuit however, as described above in regard to the storage circuit 402, the storage circuit 412 can be any structure capable of storing data that can later be read from the structure. The cross-coupled inverter circuit of the storage circuit 412 includes PMOS devices M1 and M3 and NMOS devices M0 and M2. The gates of the PMOS devices M1 and M3 and NMOS devices M0 and M2 are cross-coupled as shown.

The active cell 210A also includes a save control circuit 414 and a restore control circuit 416. The save control circuit 414 allows the data applied to nodes sb and st to be applied to the bit lines bit and bit_n, respectively. The save control circuit 414 includes save drivers I53 and I54 and save pass gates M14 and M17. The save control circuit 414 can optionally include an inverter I27 on the save control node 420 so as to match the polarity of the control signal to the polarity of the gates of the pass gates M14 and M17. The driver I53 is coupled in series between node st and pass gate M14. Similarly, driver I54 is coupled in series between node sb and pass gate M17. The outputs of the pass gates M14 and M17 are coupled to the bit_n and bit bitlines to the base cells 220A, 222A and 224A.

The restore control circuit 416 includes restore drivers I0 and I1 and restore pass gates M29 and M30. The restore control circuit 416 can optionally include an inverter I28 on the restore control node 422 so as to match the polarity of the control signal to the polarity of the gates of the pass gates M29 and M30. The driver I0 is coupled in series between bitline bit_n and pass gate M29. Similarly, driver I1 is coupled in series between bitline bit and pass gate M30. The outputs of the pass gates M29 and M30 are coupled to the node st and node in the storage circuit 412.

The pass gates I57, I58, M14, M17, M29 and M30 only pass data signals and do not amplify the respective data signals that pass through them. The drivers I0, I1, I53 and I54 provide minimal amplification to the respective data signals that pass through them to and from the corresponding bitlines bit and bit_n. However, it should be understood that the amplification applied by the drivers I0, I1, I53 and I54 is very limited due to relative short length of the bitlines bit and bit_n. Further, the amplification applied by the drivers I0, I1, I53 and I54 can also be limited because the amplification needed is very small amount. By way of example, each of the storage circuits 402 and 412 can store a logical 1 value as about 0.6 volts. By way of example, in a restore operation, the drivers I0 and I1 must only detect a logical high value stored in the storage circuit 402 (e.g., about 0.6 volts) and then amplify that logical high value sufficient enough to ensure that about 0.6 volts (i.e., a logical 1 value) can be stored in the storage circuit 412.

Further, very few devices are attached to the bitlines bit and bit_n and therefore the load on the drivers I0, I1, I53 and I54 is further reduced. As a result, each of the pass gates I57, I58, M14, M17, M29 and M30 and the drivers I0, I1, I53 and I54 can be relatively small devices. By way of example, the pass gates I57, I58, M14, M17, M29 and M30 and the drivers I0, I1, I53 and I54 can have device sizes approximately equal to the device size of the devices M0, M1, M2, M3, I59, I60, I61, and I62 included in the storage circuits 402 and 412.

The active cell 210A can optionally include a pre-charge and pull-up circuit 430. The pre-charge and pull-up circuit 430 includes pull-up devices I47, I48, I49 and I52. The pull-up devices I47, I48, I49 and I52 couple VCC to the bit lines bit_n and bit when the data is not being saved or restored between the storage cell 412 and any of the other storage circuits in any of the base cells 220A–224A. By way of example, when neither of the control signals save_n and rsto_n are applied to the control nodes 420 and 422, the pull-up devices I47, I48, I49 and I52 are forward biased and VCC is coupled across the pull-up devices I47 and I52 to bit line bit_n and VCC is coupled across the pull-up devices I48 and I49 to bit line bit.

The active cell 210A can optionally include a keeper circuit 440. The keeper circuit 430 includes cross-coupled devices I50 and I51. By way of example, when a logical low voltage is present on bit line bit_n, an inverse logical voltage (i.e., a logical high voltage) should be present on the bit line bit. When the logical low voltage is present on bit line bit_n, the gate to PMOS device I51 is also pulled low, causing the PMOS device I51 to couple VCC to bit line bit.

It should be understood that the devices I47, I48, I49, I52, I50 and I51 in the pre-charge and pull-up circuit 430 and the keeper circuit 440 can have device sizes approximately equal to the device size of the devices M0, M1, M2, M3, I59, I60, I61, and I62 included in the storage circuits 402 and 412. The devices I47, I48, I49, I52, I50 and I51 can be sized due to the substantially the same reasons set out above for pass gates I57, I58, M14, M17, M29 and M30 and the drivers I0, I1, I53 and I54.

Figure 5:
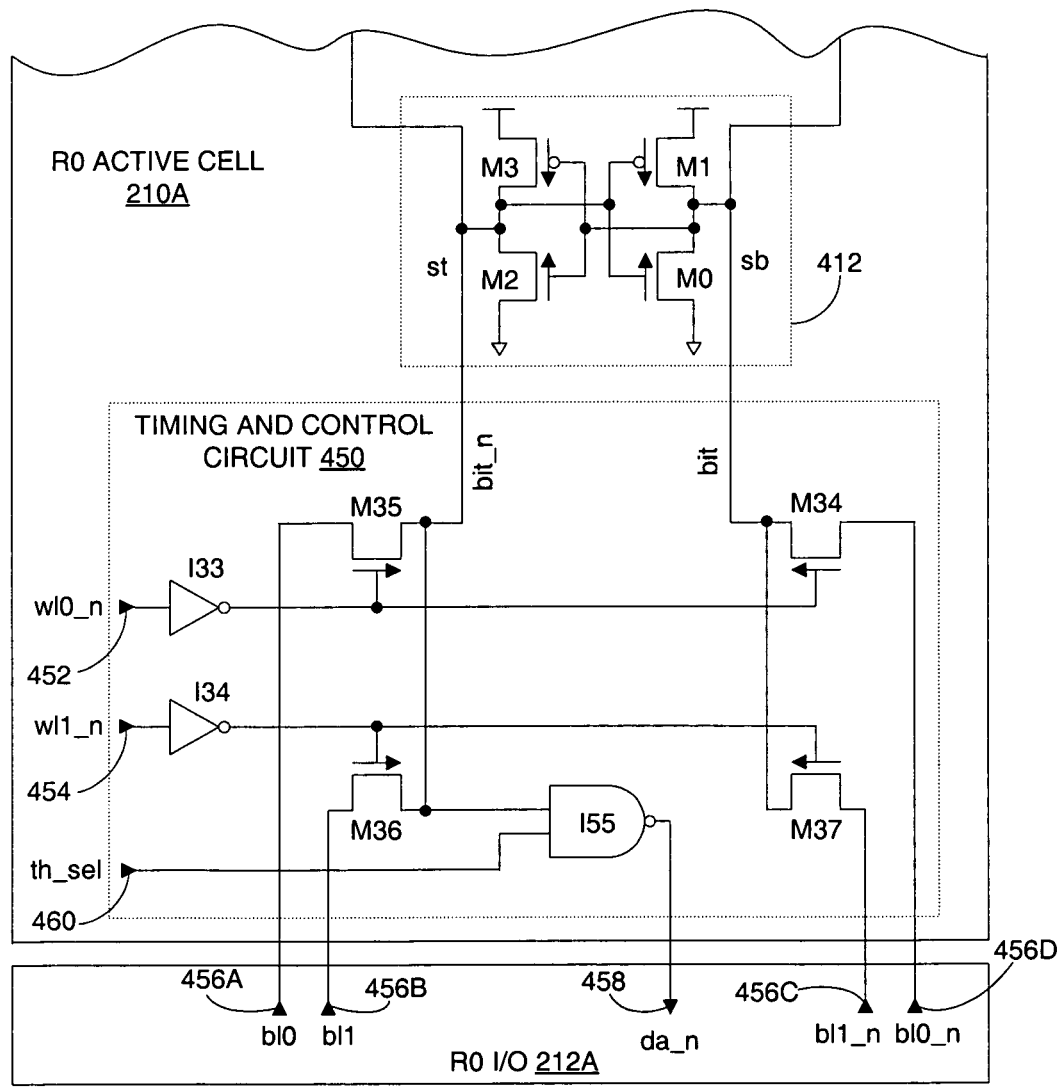
FIG. 5 is a schematic diagram of a timing and control circuit optionally included in the active cell, in accordance with one embodiment of the present invention.

FIG. 5 is a schematic diagram of a timing and control circuit 450 optionally included in the active cell 210A, in accordance with one embodiment of the present invention. The timing and control circuit 450 provides a system for controlling when data is written to or read from the storage circuit 412. Reading circuit includes a Nand gate I55. Bit line bit_n and thread select control signal th_sel node 460 are coupled to two inputs of Nand gate I55. The output node 458 of the Nand gate I55 is the da_n (i.e., inverse data) of the data present on bit line bit_n (i.e., data present on node st of the storage circuit 412). Although not shown, it should be understood that the Nand gate I55 could similarly be coupled to bit line bit and thereby output the data present on bit line bit (i.e., data present on node sb of the storage circuit 412) to output node 458.

The timing and control circuit 450 also includes two write control circuits. The first write control circuit includes inverter I33 and pass gates M34 and M35. In operation, a write control signal wl0_n in applied to control node 452 of the inverter I33. The output of the inverter I33 is applied to the gates of each of the pass gates M34 and M35. When activated, pass gate M34 passes the data applied to bl0_n at node 456D to node sb of the storage cell 412 and pass gate M35 passes the data applied to bl0 at node 456A to node st of the storage cell 412.

The second write control circuit includes inverter I34 and pass gates M37 and M36. In operation, a write control signal wl1_n in applied to control node 454 of the inverter I34. The output of the inverter I34 is applied to the gates of each of the pass gates M36 and M37. When activated, pass gate M37 passes the data applied to bl1_n at node 456C to node sb of the storage cell 412 and pass gate M36 passes the data applied to bl1 at node 456B to node st of the storage cell 412.

Figure 6:
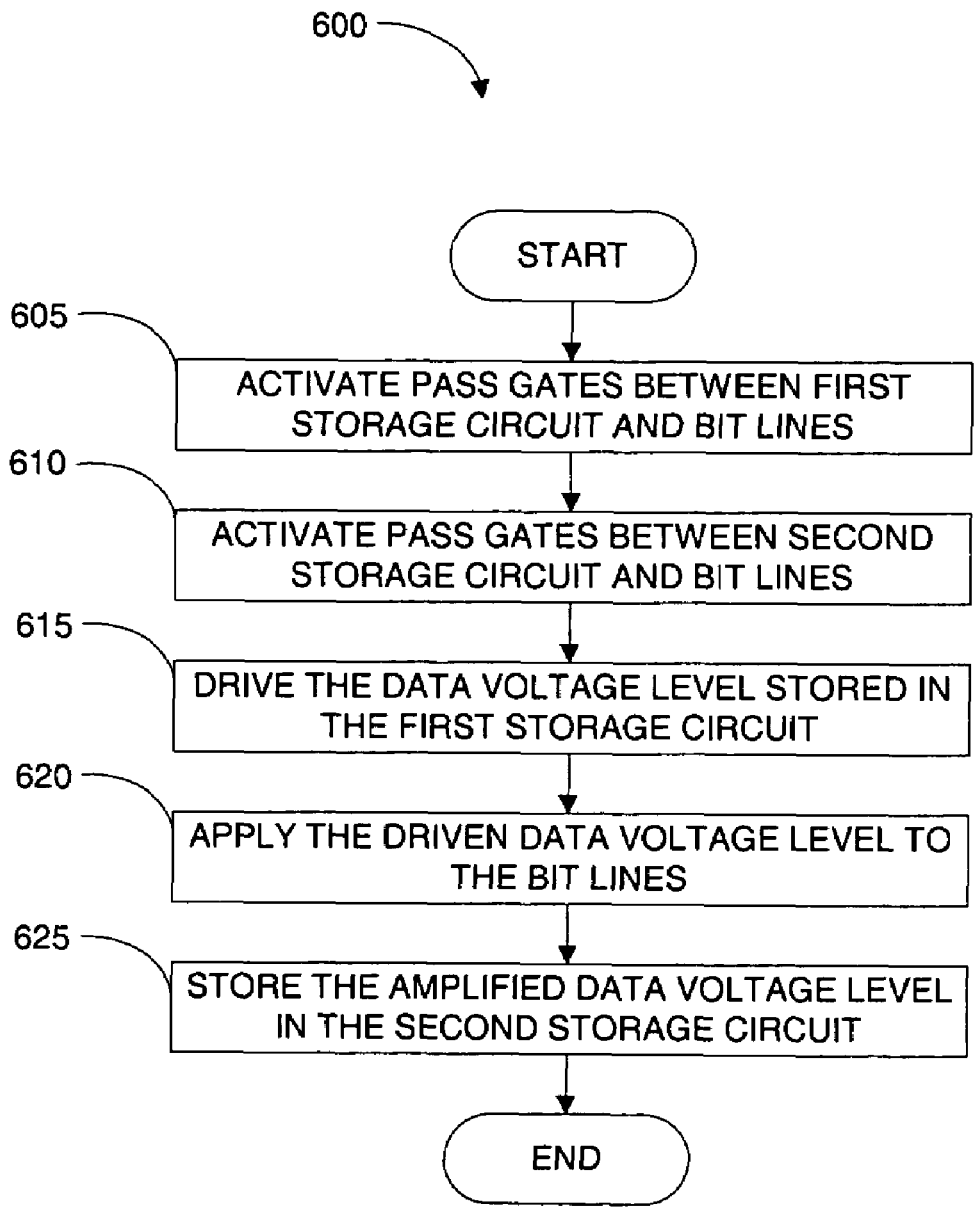
FIG. 6 is a flowchart of the method operations of a data swap operation between two storage circuits, in accordance with one embodiment of the present invention.

FIG. 6 is a flowchart of the method operations 600 of a data swap operation between two storage circuits 402 and 412, in accordance with one embodiment of the present invention. In an operation 605, the pass gates that couple a first storage circuit 402 to the bit lines bit_n and bit are activated. By way of example and as shown in FIG. 4, in a restore operation (e.g., transfer data from storage circuit 402 to storage circuit 412) pass gates I57 and I58 are activated by a wordline control signal wlb$_{Tn}$ applied to node 404.

In an operation 610, the pass gates that couple a second storage circuit 412 to the bit lines bit_n and bit are activated. Continuing the above example, a restore control signal rsto_n is applied to input node 422 of inverter I28. The output of inverter I28 activates pass gates M29 and M30.

In an operation 615, the data voltage level stored in the first storage circuit is amplified and in operation 620 the amplified data voltage level is applied to the bit lines. Continuing the above example, drivers I0 and I1 drive the data on the respective nodes stb and sbb of the first storage circuit 402 to respective bit lines bit_n and bit and to respective nodes st and sb of the second storage circuit 412.

In an operation 625, the amplified data voltage level output from the bit lines is stored in the second storage circuit. Continuing the above example, the data voltage level on the nodes st and sb are stored in the second storage circuit 412.

In an alternative example of a save operation (i.e., transferring data from the second storage circuit 412 to the first storage circuit 402), the pass gates M14 and M17 are activated by a control signal save_n applied to node 420. Pass gates I57 and I58 are activated by a wordline control signal wlb$_{Tn}$ applied to node 404. Drivers I53 and I54 drive the data on the respective nodes st and sb of the second storage circuit 412 to respective bit lines bit_n and bit and to respective nodes stb and sbb of the first storage circuit 402. The data voltage level on the nodes stb and sbb are stored in the first storage circuit 402.

As shown above, data can be transferred between an active cell 210A any one or more of multiple base cells 220A–224A that are coupled to the same bit line or bit lines. In one embodiment, four or eight or more base cells are coupled to each active cell by one or two transfer bit lines.

As described above, the data transfer drivers I0, I1, I53 and I54 and pre-charge devices I47, I48, I49 and I52 and keeper devices I50 and I51 are very small (e.g., core sized devices) and localized within the active memory cell 210A, a lot of die area is saved which reduces the overall physical size of the active cell 210A. Further, as the data transfer drivers I0, I1, I53 and I54 and pre-charge devices I47, I48, I49 and I52 and keeper devices I50 and I51 are core-sized devices, then the layout can also be simplified. By way of example, the bit lines bit_n and bit can be very short. As a result, the data can be transferred between the active cell 210A and the base cells 220A–224A in less time (i.e., faster data transfer speed).

During a save operation (i.e., swap data from active cell 210A to base cell 224A), since data is transferred thru small inverters I53 and I54, there is a parasitic read can occur which can oppose the save operation because the device sizes of the driving inverter and base cell 220A–224A are approximately the same. As a result, the 430 and 440 are used to make sure that the parasitic save operation does not occur and thereby improve the writability and provide a more robust swap operation.

In a first approach, the control signal save_n can be applied to node 420 early. By way of example, the control signal save_n can be applied to node 420 approximately two gate delays before the base cell wordline control signal $wlb_{In}$ is applied to node 404 so that a sufficient voltage differential is developed on bitlines bit and bit_n to obviate any parasitic read effect from storage nodes stb and sbb in base cell 224A.

In a second approach, a PMOS cross-coupled keeper circuit of PMOS I50 and I51 can be used so that transfer bitlines are not pulled low due to parasitic read. The PMOS keeper devices I50 and I51 also help during the save operation.

In a third approach, the drivers I53 and I54 and the save pass gates M14 and M17 can be sized up a slightly as compared to the NMOS pass gates I58 and I57 in base cell 224A to improve the drive strength and thereby make the save operation more robust. By way of example, the drivers I53 and I54 and the pass gates M14 and M17 can have device sizes about two or about three times larger than the pass gates I58 and I57. It should be understood that the drivers I53 and I54 and the save pass gates M14 and M17 can be sized according to the length of the bit lines bit_n and bit and the number of base cells 220A–224A that are coupled to the bit lines bit_n and bit. By way of example, if the length of the bit lines bit_n and bit is very small then drivers I53 and I54 and the save pass gates M14 and M17 can be sized approximately the same size as the pass gates I58 and I57 and the other devices in the storage circuits 402 and 412.

During a restore operation (i.e., data swap from base cell 220A–224A to active cell 210A), there is no conflict between the parasitic read and write as storage nodes st and sb in active cell discharge path are blocked during restore since th_sel is not asserted.

As used herein in connection with the description of the invention, the term "about" means +/−10%. By way of example, the phrase "about 250" indicates a range of between 225 and 275. With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data that can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A memory system comprising:
   an active storage circuit; and
   at least one base storage circuit coupled to the active storage circuit through at least one pass gate, at least one driver and a bit line, wherein the at least one pass gate and the at least one driver have a device size substantially similar to a device size of each one of a plurality of devices in the active storage circuit and the at least one base storage circuit, wherein the at least one pass gate includes at least one save pass gate and at least one restore pass gate.

2. The memory system of claim 1, wherein the memory system is included in a microprocessor.

3. The memory system of claim 1, wherein the at least one restore pass gate has a device size substantially similar to a device size of each one of a plurality of devices in the active storage circuit and the at least one base storage circuit and wherein the at least one save pass gate has a device size sufficient to overcome a parasitic read operation.

4. The memory system of claim 1, further comprising a pre-charge circuit coupled to the at least one bit line.

5. The memory system of claim 1, further comprising a keeper circuit coupled to the at least one bit line.

6. The memory system of claim 1, further comprising a timing and control circuit coupled to the at least one bit line.

7. The memory system of claim 1, wherein the at least one base storage circuit includes a plurality of base storage circuits and wherein each one of the plurality of base storage circuits corresponds to a processing thread in a multi-thread processor.

8. A memory system comprising:
an active storage circuit having a first active node and a second active node;
a plurality of base storage circuits, each one of the base storage circuits including a corresponding first base node and a corresponding second base node;
a first bit line coupled between the first active node and each one of the plurality of first base nodes, the first bit line including a first save pass gate and a first save driver coupled in series to the first node and a first restore pass gate and a first restore driver coupled in series to the first node; and
a second bit line coupled between the second active node and each one of the plurality of second base nodes, the second bit line including a second save pass gate and a second save driver coupled in series to the second node and a second restore pass gate and a second restore driver coupled in series to the second node, wherein the first save pass gate, the first save driver, the first restore pass gate, the first restore driver, the second save pass gate, the second save driver, the second restore pass gate and the second restore driver have a device size substantially similar to a device size of each one of a plurality of devices in the active storage circuit and the plurality of base storage circuits.

9. Method of swapping data between two storage circuits comprising:
activating a first pass gate between a first storage circuit and a first bit line wherein the first pass gate is a save pass gate and wherein the save pass gate is activated at least a first time delay before the second pass gate is activated;
activating a second pass gate between a second storage circuit and the first bit line;
driving the data stored in the first storage circuit to the first bit line; and
storing the data on the first bit line in the second storage circuit.

10. The method of claim 9, wherein driving the data stored in the first storage circuit to the first bit line includes amplifying the data stored in the first storage circuit in an amplification circuit having device sizes substantially equal to the devices in the first storage circuit and the second storage circuit.

11. The method of claim 9, wherein driving the data stored in the first storage circuit to the first bit line includes amplifying the data stored in the first storage circuit in an amplification circuit having device sizes sufficient to overcome a parasitic read operation.

12. The method of claim 9, wherein the first time delay is equal to about two gate delays.

13. The method of claim 9, wherein the first time delay is sufficient to allow a sufficient voltage differential to be developed on the first bit line.

14. The method of claim 9, further comprising applying a keeper circuit to the first bit line.

15. The method of claim 9, wherein the first storage circuit is an active storage circuit and the second storage circuit is a base storage circuit and wherein the base storage circuit includes a plurality of base storage circuits and wherein each one of the plurality of base storage circuits corresponds to a processing thread in a multi-thread processor.

16. Method of performing a data swap in a multi-threaded microprocessor comprising:
activating a first active pass gate between a first node of an active storage circuit and a first bit line and activating a second active pass gate between a second node of the active storage circuit and a second bit line;
activating a first base pass gate between a first node of a base storage circuit and the first bit line, wherein the first pass gate is a save pass gate and wherein the save pass gate is activated at least a first time delay before the second pass gate is activated, and activating a second base pass gate between a second node of a base storage circuit and the second bit line;
driving the data stored in the active storage circuit to the first bit line and the second bit line; and
storing the data on the first bit line and the second bit line in the base storage circuit.

17. The method of claim 16, wherein the base storage circuit is one of a plurality of base storage circuits coupled to the first bit line and the second bit line and wherein each one of the plurality of base storage circuits corresponds to one of a plurality of processing threads and wherein activating the first base pass gate and activating the second base pass gate includes receiving a thread select control signal that corresponds to a selected process thread and a corresponding base storage circuit.

* * * * *